United States Patent
Ichikawa et al.

(10) Patent No.: US 9,819,104 B2
(45) Date of Patent: Nov. 14, 2017

(54) CONNECTOR AND ELECTRONIC EQUIPMENT

(71) Applicants: JAPAN AVIATION ELECTRONICS INDUSTRY, LIMITED, Shibuya-ku, Tokyo (JP); SONY CORPORATION, Minato-ku, Tokyo (JP)

(72) Inventors: Hisayoshi Ichikawa, Tokyo (JP); Takamitsu Wada, Tokyo (JP); Shinya Hattori, Tokyo (JP)

(73) Assignees: JAPAN AVIATION ELECTRONICS INDUSTRY, LIMITED, Shibuya-Ku, Tokyo (JP); SONY CORPORATION, Minato-Ku, Tokyo (JP)

( * ) Notice: Subject to any disclaimer, the term of this patent is extended or adjusted under 35 U.S.C. 154(b) by 0 days.

(21) Appl. No.: 15/302,969

(22) PCT Filed: Mar. 31, 2015

(86) PCT No.: PCT/JP2015/060062
§ 371 (c)(1),
(2) Date: Oct. 7, 2016

(87) PCT Pub. No.: WO2015/159701
PCT Pub. Date: Oct. 22, 2015

(65) Prior Publication Data
US 2017/0033477 A1 Feb. 2, 2017

(30) Foreign Application Priority Data
Apr. 18, 2014 (JP) ................. 2014-086371

(51) Int. Cl.
H01R 12/00 (2006.01)
H01R 12/70 (2011.01)
H01R 12/71 (2011.01)

(52) U.S. Cl.
CPC ..... H01R 12/7023 (2013.01); H01R 12/7052 (2013.01); H01R 12/714 (2013.01); *H05K 2201/10189* (2013.01)

(58) Field of Classification Search
CPC ............ H01R 12/7023; H01R 12/7052; H01R 12/714; H05K 2201/10189
(Continued)

(56) References Cited

U.S. PATENT DOCUMENTS

| 6,171,113 B1 | 1/2001 | Wada et al. |
| 2002/0025701 A1 | 2/2002 | Okamoto |
| 2007/0173118 A1 | 7/2007 | Chen |

FOREIGN PATENT DOCUMENTS

| JP | 05085099 U | 11/1993 |
| JP | 2000036358 A | 2/2000 |

(Continued)

OTHER PUBLICATIONS

International Search Report (ISR) and Written Opinion dated Jun. 2, 2015 issued in International Application No. PCT/JP2015/060062.
(Continued)

*Primary Examiner* — Khiem Nguyen
(74) *Attorney, Agent, or Firm* — Holtz, Holtz & Volek PC

(57) ABSTRACT

A connector is attachable to an object having a lock portion. The connector includes a housing and a frame. The housing has a press portion and a support portion. The housing is fixed to the object under an attached state where the connector is attached to the object. The frame has a supported portion, a pressed portion and a locked portion. When the connector is in the attached state, the supported portion is positioned between the pressed portion and the locked portion in a front-rear direction and is supported from below by the support portion in an up-down direction perpendicular to the front-rear direction. Under the attached state, the
(Continued)

pressed portion is pressed by the press portion from above. Under the attached state, the locked portion applies a force to the lock portion from below.

14 Claims, 13 Drawing Sheets

(58) Field of Classification Search
USPC .................................. 439/62, 79, 82, 567
See application file for complete search history.

(56) References Cited

FOREIGN PATENT DOCUMENTS

| JP | 2002075496 A | 3/2002 |
|----|--------------|--------|
| JP | 2002075560 A | 3/2002 |
| JP | 2002151191 A | 5/2002 |
| TW | M378512 U | 4/2010 |

OTHER PUBLICATIONS

Taiwanese Office Action (and English translation thereof) dated Oct. 4, 2016 issued in counterpart Taiwanese Application No. 104111073.

US 9,819,104 B2

CONNECTOR AND ELECTRONIC EQUIPMENT

TECHNICAL FIELD

This invention relates to a connector which is attachable to an object such as a circuit board or the like and which comprises a housing and a frame each of which is to be attached to the object.

BACKGROUND ART

This type of connector is disclosed in, for example, Patent Document 1.

As shown in FIG. 25, an IC card connector (connector) 900 disclosed in Patent Document 1 comprises a housing 910 and a frame 920 each of which is to be attached to a circuit board 990. The frame 920 has engagement pieces 922 and an upper plate portion 924. The frame 920 holds ground terminals 930. Each of the ground terminals 930 has two engagement lugs 932. Each of the engagement lugs 932 is formed with a projecting end 934. The circuit board 990 is formed with attachment holes 992. When the connector 900 is attached to the circuit board 990, first of all, the housing 910 is fixed to the circuit board 990. Next, the engagement pieces 922 and the upper plate portion 924 of the frame 920 are attached to the housing 910, and the engagement lugs 932 of the ground terminal 930 are then inserted into each of the attachment holes 992. Each of the projecting ends 934 of the engagement lugs 932 is pressed to a wall surface of each of the attachment holes 992, so that the frame 920 is attached to the circuit board 990.

PRIOR ART DOCUMENTS

Patent Document(s)

Patent Document 1: JP A 2002-75496

SUMMARY OF INVENTION

Technical Problem

In a case, for example, where the connector 900 of Patent Document 1 is attached to the circuit board 990 having a thin thickness, the frame 920 might be unstable. Accordingly, it is necessary to fix the engagement lugs 932 to the circuit board 990 by soldering or the like after the frame 920 is attached to the circuit board 990. In other words, it is difficult to apply the frame 920 of Patent Document 1 to each of circuit boards having various thicknesses.

It is therefore an object of the present invention to provide a connector which is attachable to an object such as a circuit or the like and which enables a frame to be more stably attached to each of objects having various thicknesses.

Solution to Problem

An aspect of the present invention provides a connector attachable to an object having a lock portion. The connector comprises a housing and a frame. The housing has a press portion and a support portion. The housing is fixed to the object under an attached state where the connector is attached to the object. The frame has a supported portion, a pressed portion and a locked portion. When the connector is in the attached state, the supported portion is positioned between the pressed portion and the locked portion in a front-rear direction and is supported from below by the support portion in an up-down direction perpendicular to the front-rear direction. Under the attached state, the pressed portion is pressed by the press portion from above. Under the attached state, the locked portion applies a force to the lock portion from below.

Another aspect of the present invention provides an electronic equipment in which the connector is installed.

Advantageous Effects of Invention

According to the present invention, under the attached state where the connector is attached thereto, the locked portion of the frame applies force to the lock portion of the object from below. In other words, the locked portion is pressed on the lock portion. Accordingly, even if a position of the lock portion in the up-down direction is different from its design value, the locked portion is locked by the lock portion. Especially, if the lock portion is positioned in the vicinity of a lower end of an attachment hole of an object, the locked portion can be locked by the lock portion even in a case where thicknesses of objects are varied. The frame of the connector according to the present invention can be more stably attached to each of objects having various thicknesses.

An appreciation of the objectives of the present invention and a more complete understanding of its structure may be had by studying the following description of the preferred embodiment and by referring to the accompanying drawings.

DESCRIPTION OF EMBODIMENTS

Figure 1:
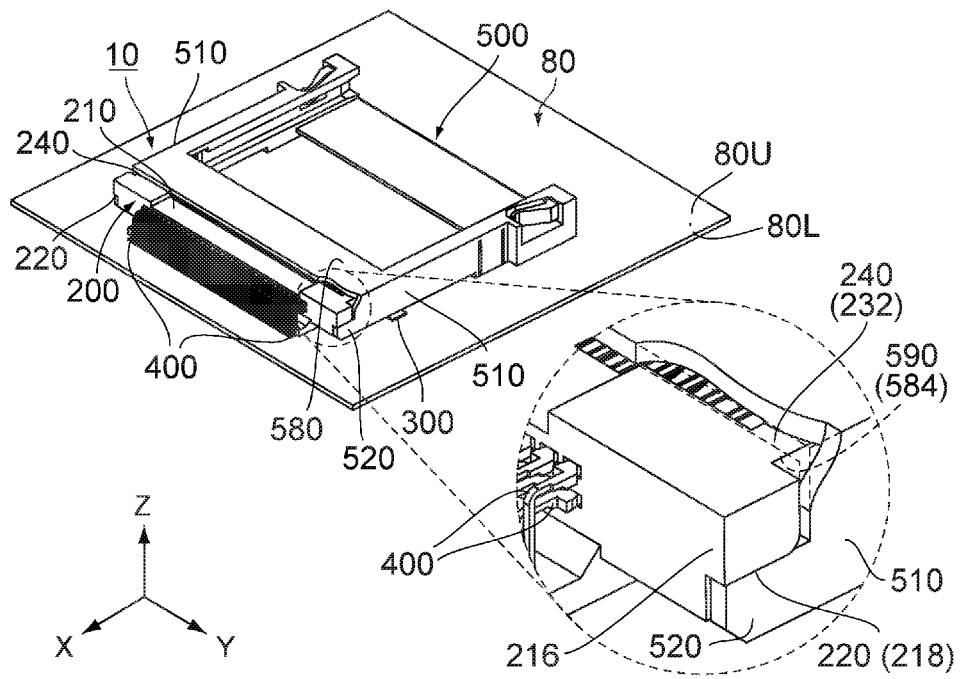
FIG. 1 is a perspective view showing a connector according to an embodiment of the present invention. The connector is in an attached state where the connector is attached to a circuit board. The connector is illustrated so that the vicinity of a supported portion of a frame is cut away. The vicinity of the supported portion (a part enclosed by dashed line) is shown enlarged.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

As shown in FIG. 1, a connector 10 according to an embodiment of the present invention is an on-board connector which is attachable to an object (circuit board) 80. In addition, the connector 10 according to the present embodiment is a card connector which is connectable to a connecting object (not shown) such as a card or the like. However, the present invention is also applicable to a connector other than the card connector.

Figure 2:
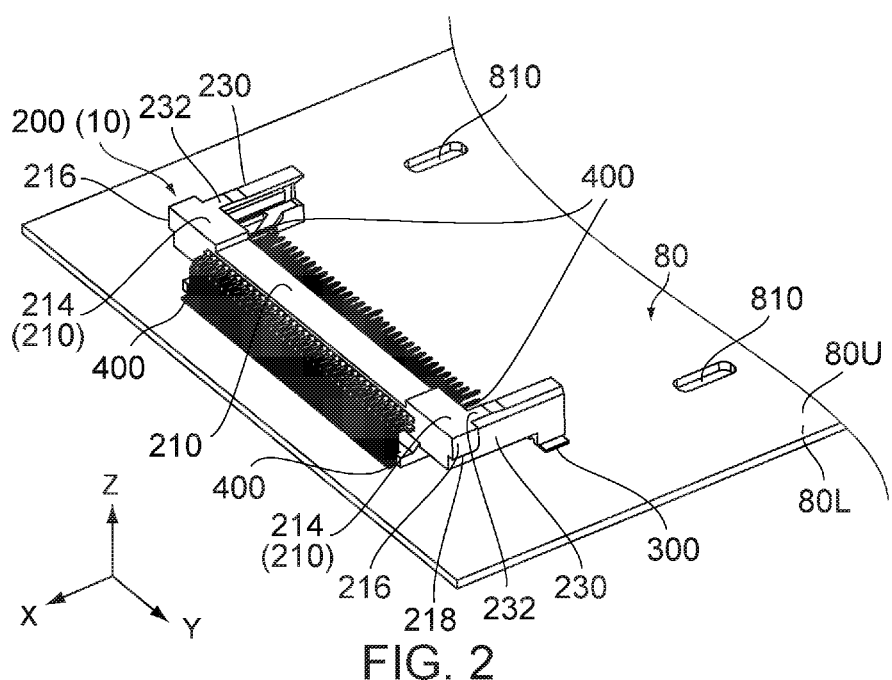
FIG. 2 is a perspective view showing a housing of the connector of FIG. 1. The housing is fixed on the circuit board.

As shown in FIG. 2, the circuit board 80 has an upper surface 80U and a lower surface 80L in an up-down direction (Z-direction). Each of the upper surface 80U and the lower surface 80L is perpendicular to the Z-direction. The circuit board 80 according to the present embodiment is formed with two attachment holes 810. Each of the attachment holes 810 pierces the circuit board 80 in the Z-direction.

As shown in FIG. 1, the connector 10 according to the present embodiment comprises a housing 200 made of insulating material, two holddowns 300 each made of conductive material, a plurality of contacts 400 each made of conductive material and a frame 500 made of insulating material. In particular, each of the housing 200 and the frame 500 according to the present embodiment is made of resin.

As shown in FIG. 2, the housing 200 according to the present embodiment has a holding portion 210 and two arm portions 230. The holding portion 210 extends long in a Y-direction (width direction). The holding portion 210 has two side portions 214. The side portions 214 are positioned at opposite ends, respectively, of the holding portion 210 in the Y-direction. The arm portions 230 extend rearward (in a negative X-direction) from the side portions 214, respectively, in an X-direction (front-rear direction). Each of the arm portions 230 has an upper surface (support surface) 232. Thus, the housing 200 has two of the support surfaces 232. The support surface 232 is perpendicular to the Z-direction. The support surfaces 232 according to the present embodiment are formed to be flush with upper surfaces of the side portions 214, respectively.

The housing 200 according to the present embodiment has two overhanging portions 216. The overhanging portions 216 are formed at side surfaces of the side portions 214, respectively, in the Y-direction. Each of the overhanging portions 216 overhangs outward in the Y-direction from an upper portion (positive Z-side portion) of the corresponding side portion 214. Each of the overhanging portions 216 has a lower surface 218. The lower surface 218 is perpendicular to the Z-direction. When the connector 10 is in an attached state where the connector 10 is attached to the circuit board 80, the support surfaces 232 of the arm portions 230 (housing 200) are positioned above (in a positive Z-direction beyond) the lower surfaces 218 of the overhanging portions 216, respectively.

The holddowns 300 are held by the arm portions 230, respectively, of the housing 200. The contacts 400 are held by the holding portion 210 of the housing 200 and are arranged in the Y-direction. Under the attached state, the holddowns 300 and the contacts 400 are fixed to the upper surface 80U of the circuit board 80 by soldering or the like. Accordingly, the housing 200 according to the present embodiment is attached and fixed on the upper surface 80U of the circuit board 80 by the holddowns 300 and the contacts 400. However, the housing 200 may be attached to the circuit board 80 by other means.

Figure 3:
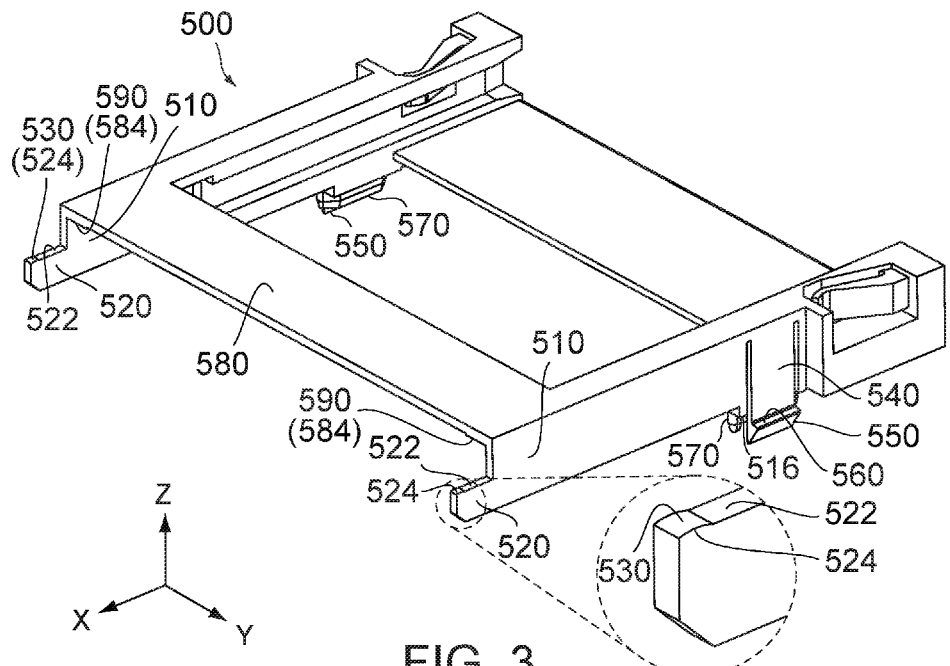
FIG. 3 is a perspective view showing the frame of the connector of FIG. 1. The frame is not attached to the housing while being positioned at a horizontal position. A part of a front end portion of the frame (a part enclosed by dashed line) is shown enlarged.

As shown in FIG. 3, the frame 500 according to the present embodiment has two side plate portions 510, two front end portions 520, two projecting portions 524 and an upper plate portion 580.

Referring to FIGS. 1 and 3, each of the side plate portions 510 extends long in the X-direction under the attached state (see FIG. 1). Under the attached state, the front end portions 520 project forward (in a positive X-direction) from lower portions (negative Z-side portions) of front ends (positive X-side ends) of the side plate portions 510, respectively. Each of the front end portions 520 has an upper surface 522. Under the attached state, the upper surface 522 is almost perpendicular to the Z-direction. The projecting portions 524 are provided on the upper surfaces 522, respectively. The projecting portions 524 project upward (in the positive Z-direction) from the upper surfaces 522, respectively.

The upper plate portion 580 couples the two side plate portions 510 with each other in the Y-direction. The upper plate portion 580 has two lower surfaces (supported surfaces) 584. The supported surfaces 584 are positioned at opposite sides, respectively, of the upper plate portion 580 in the Y-direction. Under the attached state (see FIG. 1), each of the supported surfaces 584 is almost perpendicular to the Z-direction. Under the attached state, the supported surfaces 584 are positioned above the support surfaces 232, respectively, of the housing 200 (see FIG. 1).

Figure 4:
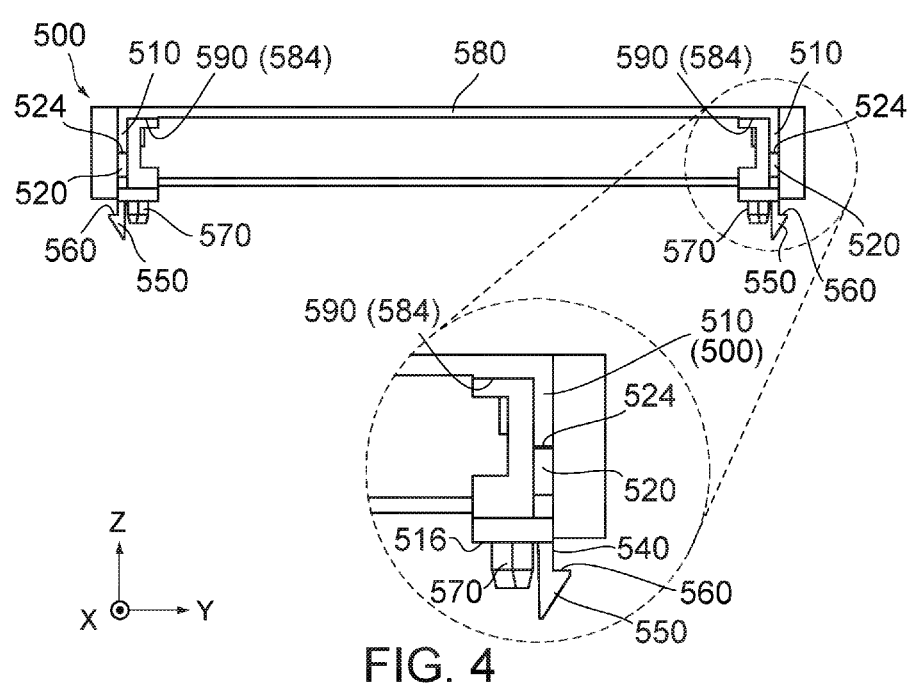
FIG. 4 is a front view showing the frame of FIG. 3. The vicinity of a side plate portion of the frame (a part enclosed by dashed line) is shown enlarged.
Figure 9:
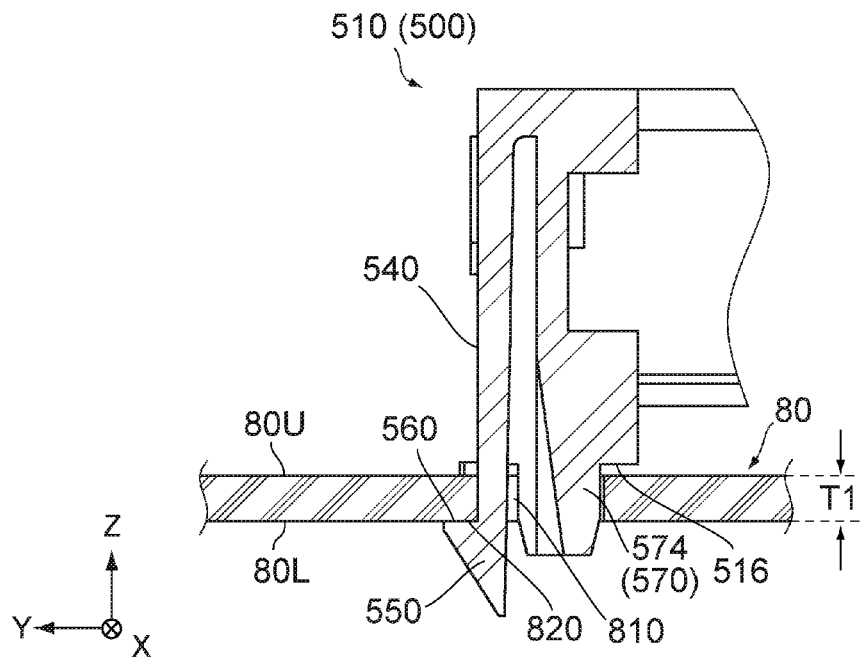
FIG. 9 is a cross-sectional view showing the side plate portion of the frame of the connector of FIG. 7, taken along line IX-IX. The frame is attached to a first circuit board.

As shown in FIGS. 3, 4 and 9, each of the side plate portions 510 is provided with a contact surface 516, a spring portion 540 and a positioning portion 570. The contact surface 516 is perpendicular to the Z-direction. Under the attached state, the contact surface 516 is positioned at a lower end (an end in a negative Z-direction) of the side plate portion 510 except the spring portion 540 and the positioning portion 570. Under the attached state, the spring portion 540 extends in the Z-direction. The spring portion 540 is resiliently deformable in the Y-direction. Each of the spring portions 540 is provided with a hook 550. The hook 550 is positioned at a lower end part (an end part in the negative Z-direction) of the spring portion 540 and projects outward in the Y-direction. The hook 550 is movable in the Y-direction by resilient deformation of the spring portion 540. Under the attached state, the positioning portion 570 extends downward from the contact surface 516.

Figure 5:
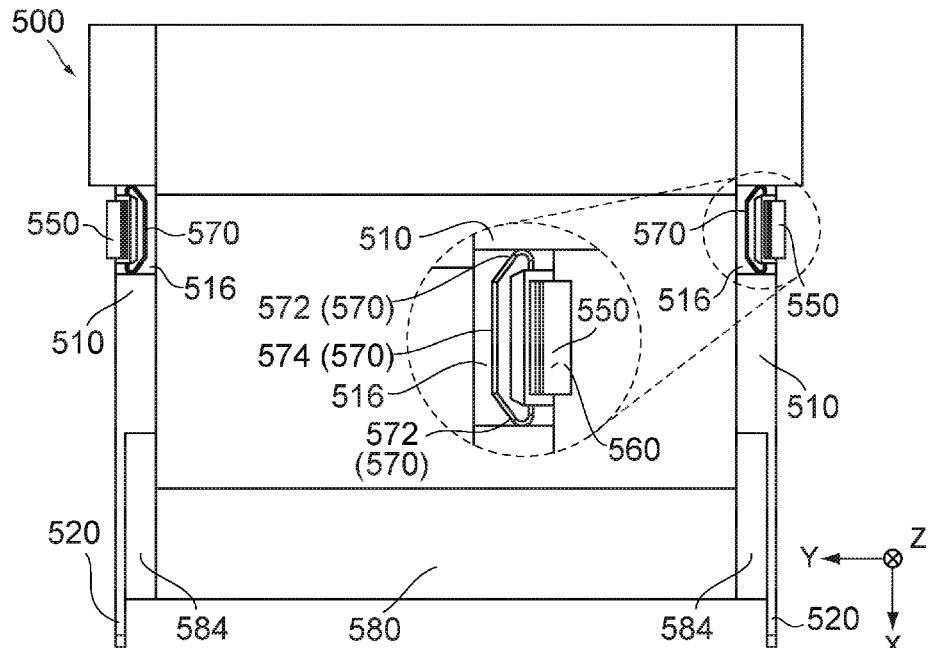
FIG. 5 is a bottom view showing the frame of FIG. 3. The vicinity of a hook of the frame (a part enclosed by dashed line) is shown enlarged.

As shown in FIG. 5, the positioning portion 570 according to the present embodiment has two bent portions 572 and a coupling portion 574 which couples the bent portions 572 with each other. The positioning portion 570 according the present embodiment is positioned inward of a locked portion 560 in the Y-direction. However, a part of the positioning portion 570 (for example, a part of the bent portion 572) may be positioned outward of the locked portion 560 in the Y-direction. In other words, it is sufficient that at least a part of the positioning portion 570 is positioned inward of the locked portion 560 in the Y-direction. The thus-configured positioning portion 570 can prevent the spring portion 540 from being excessively resiliently deformed inward in the Y-direction to be broken.

Figure 7:
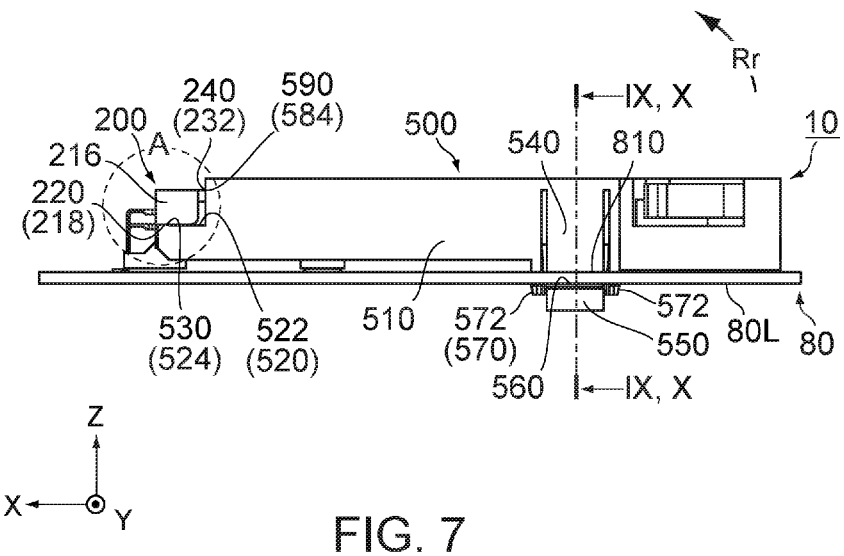
FIG. 7 is a side view showing the housing and the frame of FIG. 1.
Figure 8:
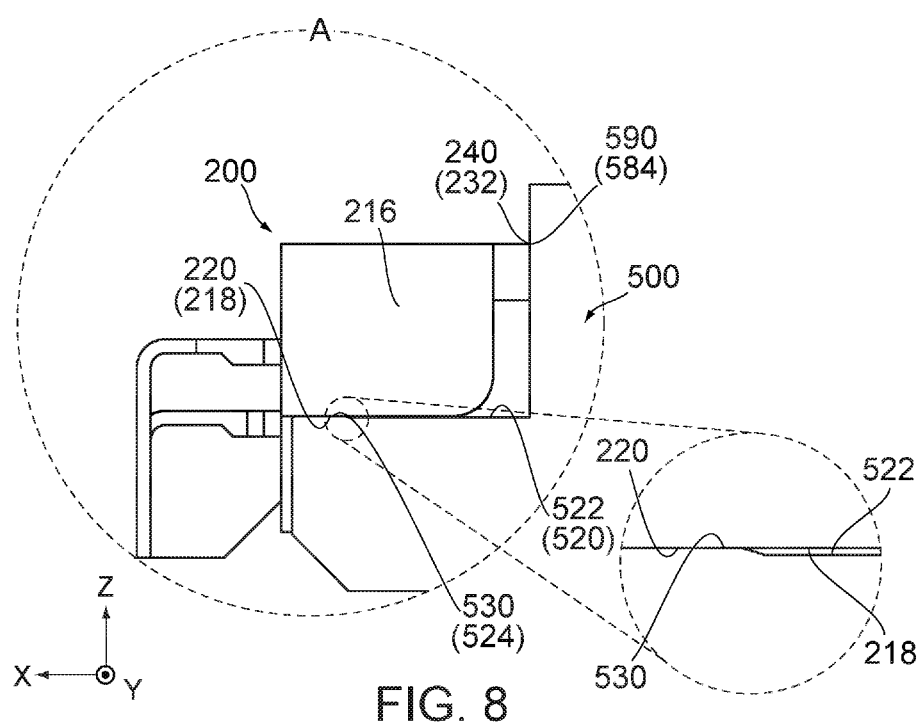
FIG. 8 is a side view showing the vicinity of the overhanging portion of the housing of FIG. 7 (a part enclosed by dashed line A). The vicinity of a press portion of the housing (a part enclosed by dashed line) is shown further enlarged.

As shown in FIGS. 3, 7 and 8, the frame 500 has two pressed portions 530 and two supported portions 590. According to the present embodiment, the pressed portions 530 are upper ends (positive Z-side ends) of the projecting portions 524, respectively, and the supported portions 590 are edges of the supported surfaces 584, respectively, of the upper plate portion 580.

As shown in FIGS. 1, 7 and 8, the housing 200 has two press portions 220 and two support portions 240. According to the present embodiment, the press portions 220 are parts of the lower surfaces 218 of the overhanging portions 216, respectively, and the support portions 240 are parts of the support surfaces 232, respectively, of the housing 200. However, the support portion 240 may be any part of the housing 200, provided that the part can support the supported portion 590 from below under the attached state. The press portion 220 may be any part of the housing 200, provided that the part can press the pressed portion 530 from above under the attached state.

As shown in FIGS. 3, 4 and 7, the frame 500 has two of the locked portions 560. The locked portions 560 are locked to the circuit board 80 under the attached state. The locked portions 560 according to the present embodiment are surfaces of the hooks 550, respectively. Under the attached state, each of the locked portions 560 according to the present embodiment extends in an XY-plane perpendicular to the Z-direction (up-down direction). Thus, each of the locked portions 560 extends in the Y-direction. However, it is enough that the locked portion 560 extends in a direction intersecting with the Z-direction under the attached state as a whole.

Figure 6:
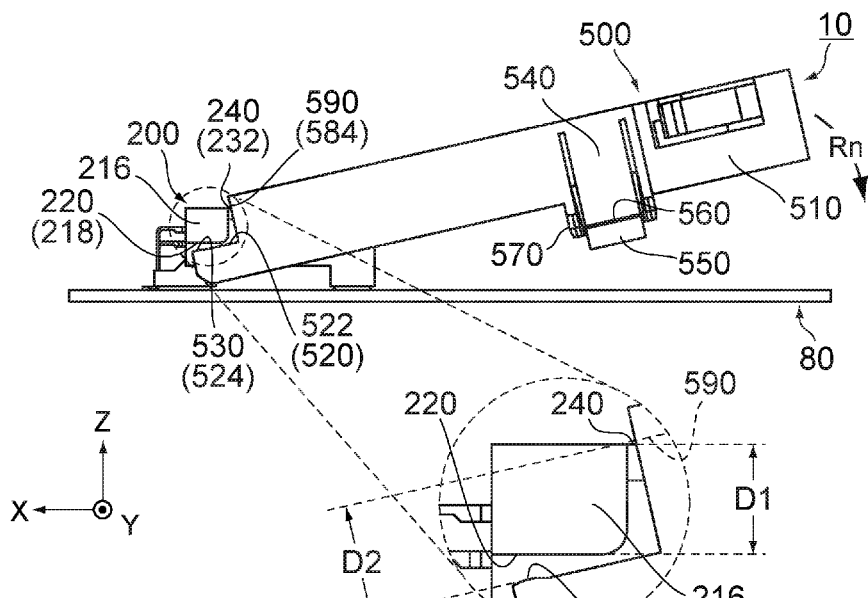
FIG. 6 is a side view showing the housing and the frame of FIG. 1. The frame is positioned at a tilted position which the frame begins to be attached to the housing. The vicinity of an overhanging portion of the housing (a part enclosed by dashed line) is shown enlarged.

As understood from FIGS. 6 and 7, under a state where the housing 200 is fixed to the circuit board 80, the frame 500 is attached to the housing 200 and the circuit board 80 by a positioning operation followed by a rotating operation. In detail, first, the positioning operation causes that the pressed portions 530 are positioned below the press portions 220, respectively, while the supported portions 590 are positioned above the support portions 240, respectively. Accordingly, the frame 500 is positioned at a tilted position (a position shown in FIG. 6) where the frame 500 is tilted with respect to the housing 200. Next, a negative X-side portion of the frame 500 is pressed downward so that the frame 500 is rotated along a rotational direction Rn (see FIG. 6) toward a horizontal position (a position shown in FIG. 7) where the frame 500 extends horizontally with respect to the housing 200. In other words, the rotating operation rotates the frame 500 from the tilted position toward the horizontal position.

As shown in FIG. 6, when the housing 200 is fixed to the circuit board 80 while the frame 500 is not attached to the housing 200, the support portion 240 and the press portion 220 are spaced apart from each other by a distance (D1) in the Z-direction. As understood from FIGS. 6 and 7, when the frame 500 is positioned at the horizontal position without being attached to the housing 200, the supported portion 590 and the pressed portion 530 are spaced apart from each other by a distance (D2) in the Z-direction. According to the present embodiment, the distance (D1) is greater than the distance (D2). Thus, upon the aforementioned rotating operation, the pressed portion 530 receives a downward force by each of the press portions 220 so that a portion of the frame 500, which is positioned beyond the supported portion 590 in the negative X-direction, receives an upward momentum. The frame 500 can be attached to the housing 200 by being rotated as described above while resisting the momentum.

As understood from FIGS. 7 and 9, when the frame 500 is moved to the horizontal position by the aforementioned rotating operation, the hooks 550 pass through the attachment holes 810, respectively, of the circuit board 80 while being moved inward in the Y-direction. When each of the hooks 550 reaches below the circuit board 80, each of the hooks 550 is moved outward in the Y-direction. Accordingly, each of the locked portions 560 is positioned below the lower surface 80L of the circuit board 80.

As shown in FIG. 7, when the connector 10 is in the attached state, the supported portions 590 are positioned between each of the pressed portions 530 and each of the locked portions 560 in the X-direction. Under the attached state, the supported portions 590 are supported from below by the support portions 240, respectively, in the Z-direction. In addition, since the distance (D1) is greater than the distance (D2) as described above (see FIG. 6), the pressed portion 530 is pressed by each of the press portions 220 from above under the attached state. Accordingly, under the attached state, each of the locked portions 560 receives a momentum along a reverse rotational direction Rr. As a result, each of the locked portions 560 is pressed against the lower surface 80L of the circuit board 80 from below under the attached state. Each of the pressed portions 530, the locked portions 560 and the supported portions 590 may be any part of the frame 500, provided that each of the pressed portions 530, the locked portions 560 and the supported portions 590 is formed as described above.

As understood from FIG. 9, parts of the lower surface 80L are pressed upward by the locked portions 560, respectively. The parts of the lower surface 80L function as lock portions 820 which lock the locked portions 560, respectively. In other words, the circuit board 80 has the lock portions 820. Under the attached state, the locked portions 560 are brought into contact with the lock portions 820 from below to apply forces to the lock portions 820, respectively, from below. Accordingly, the frame 500 is stably attached to the circuit board 80. For example, the frame 500 is prevented from being unstable. Especially, the locked portions 560 according to the present embodiment are provided on the side plate portions 510, respectively, of the frame 500. Thus, the frame 500 can be more securely prevented from being unstable.

As shown in FIGS. 7 and 9, under the attached state, the positioning portions 570 are partially inserted into the attachment holes 810, respectively. The two positioning portions 570, which are inserted into the attachment holes 810, carry out positioning of the locked portions 560, respectively, in the X-direction and in the Y-direction. According to the present embodiment, the bent portions 572 of the positioning portion 570 perform positioning of each of the locked portions 560 in the X-direction (see FIG. 7), and the coupling portion 574 performs positioning of each of the locked portions 560 in the Y-direction (see FIG. 9).

Figure 10:
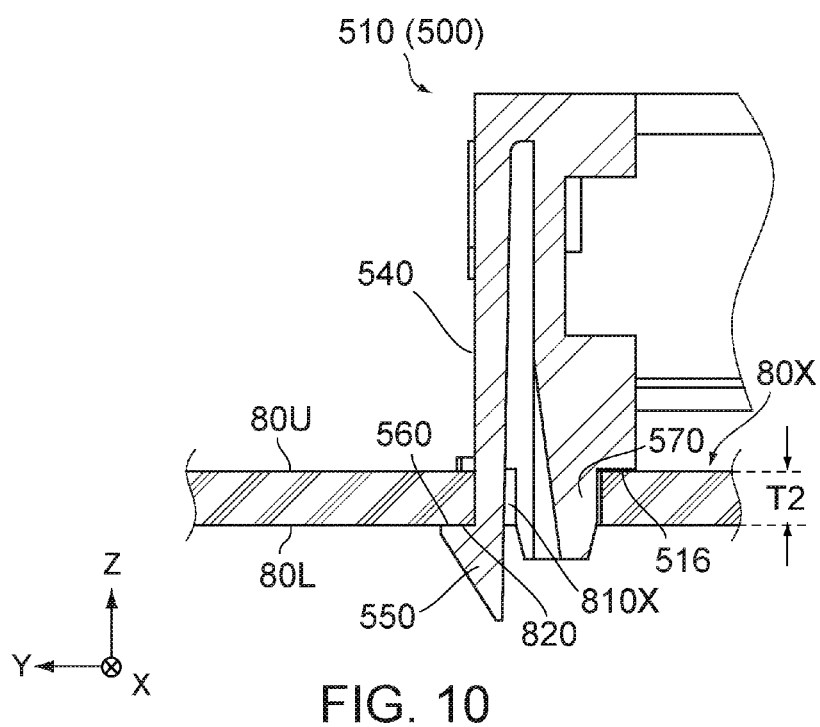
FIG. 10 is a cross-sectional view showing the side plate portion of the frame of the connector of FIG. 7, taken along line X-X. The frame is attached to a second circuit board.

As shown in FIG. 10, the thus-configured connector 10 is attachable to a circuit board (object) 80X (second circuit board) which is different from the circuit board 80 (first circuit board). In detail, as shown in FIGS. 9 and 10, the circuit board 80 has a thickness (T1), and the circuit board 80X has a thickness (T2). The thickness (T2) is greater than the thickness (T1). The circuit board 80X is formed with attachment holes 810X which are similar to the attachment holes 810. However, a size of each of the attachment holes 810X in the Z-direction is equal to the thickness (T2). Accordingly, the size of each of the attachment holes 810X in the Z-direction is greater than a size of each of the attachment holes 810 in the Z-direction.

Under the attached state, the locked portion 560 of the frame 500 applies a force to each of lock portions 820 of the circuit board 80X from below. Accordingly, the frame 500 can be stably attached also to the circuit board 80X which is thicker than the circuit board 80. Thus, even if, for example, a position of each of the lock portions 820 in the Z-direction is different from each of their design values, the locked portions 560 are locked by the lock portions 820, respectively. The frame 500 according to the present embodiment can be more stably attached to each of objects having various thicknesses.

As understood from FIGS. 9 and 10, a shape of the locked portion 560 can be modified variously. For example, the locked portion 560 may not be a plane parallel to the XY-plane, but may extend outward in the Y-direction while being tilted upward. In this case, an end portion of the locked portion 560, which is positioned outward in the Y-direction, is locked by a lock portion 820 which is a part of the lower surface 80L.

Hereafter, explanation is made about various modifications of the locked portion 560. In the various modifications as described below, members and portions other than the locked portion have structures same as those of the present embodiment. Accordingly, in the following explanation, explanation is made only about members and portions which are directly related to the locked portion.

First Modification

Figure 11:
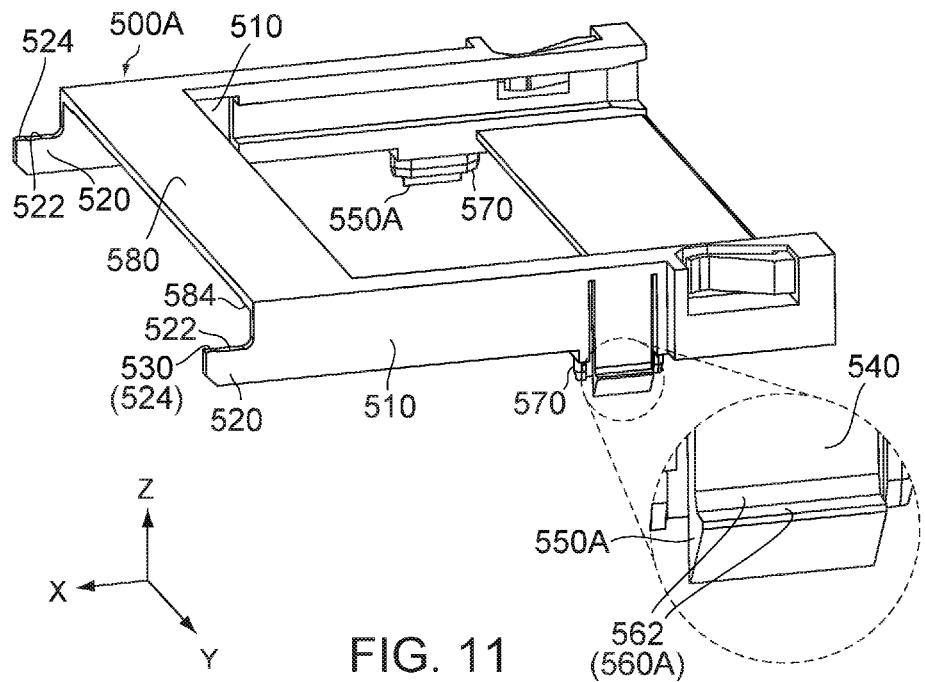
FIG. 11 is a perspective view showing a modification of the frame of FIG. 3. The vicinity of a hook of the frame (a part enclosed by dashed line) is shown enlarged.
Figure 12:
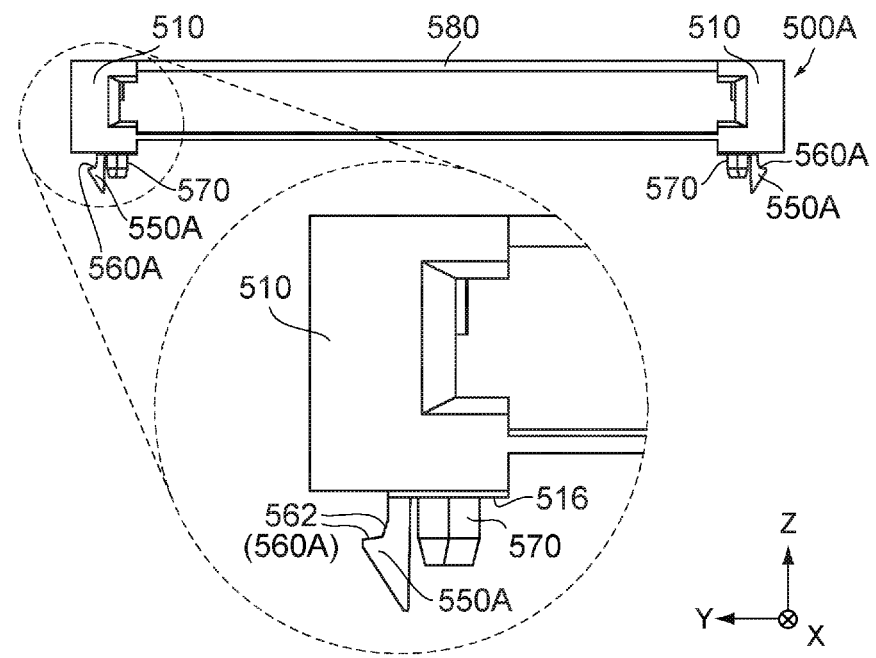
FIG. 12 is a rear view showing the frame of FIG. 11. The vicinity of a side plate portion of the frame (a part enclosed by dashed line) is shown enlarged.

As shown in FIGS. 11 and 12, a frame 500A according to a first modification has hooks 550A which are slightly different from the hooks 550 (see FIG. 3). Each of the hooks 550A has a locked portion 560A. Unlike the locked portion 560, the locked portion 560A has two slope portions 562.

Figure 13:
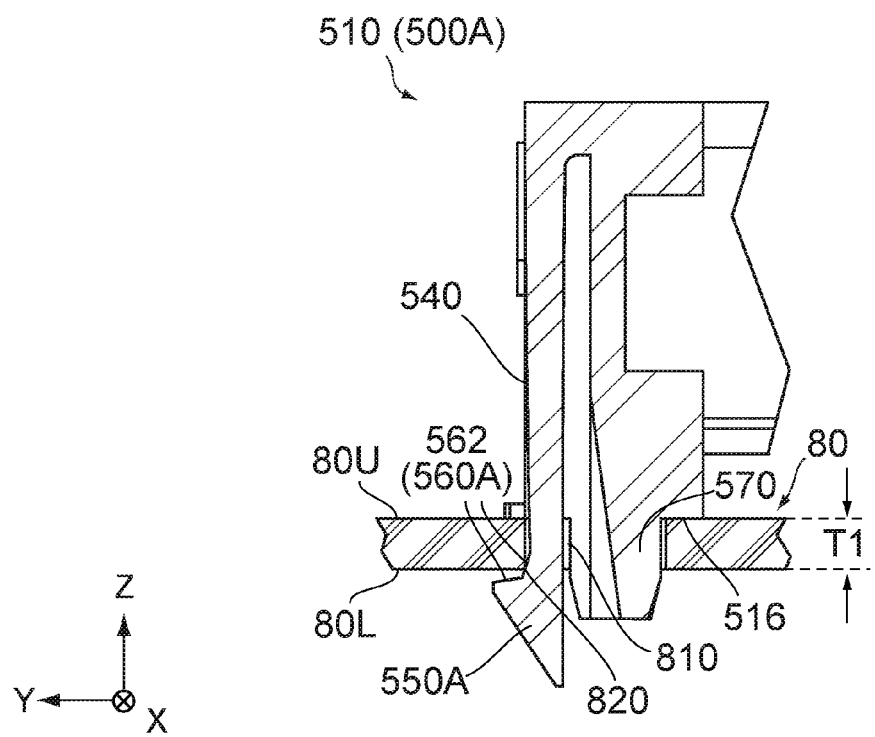
FIG. 13 is a cross-sectional view showing the side plate portion of the frame of FIG. 11. The frame is attached to the first circuit board.
Figure 14:
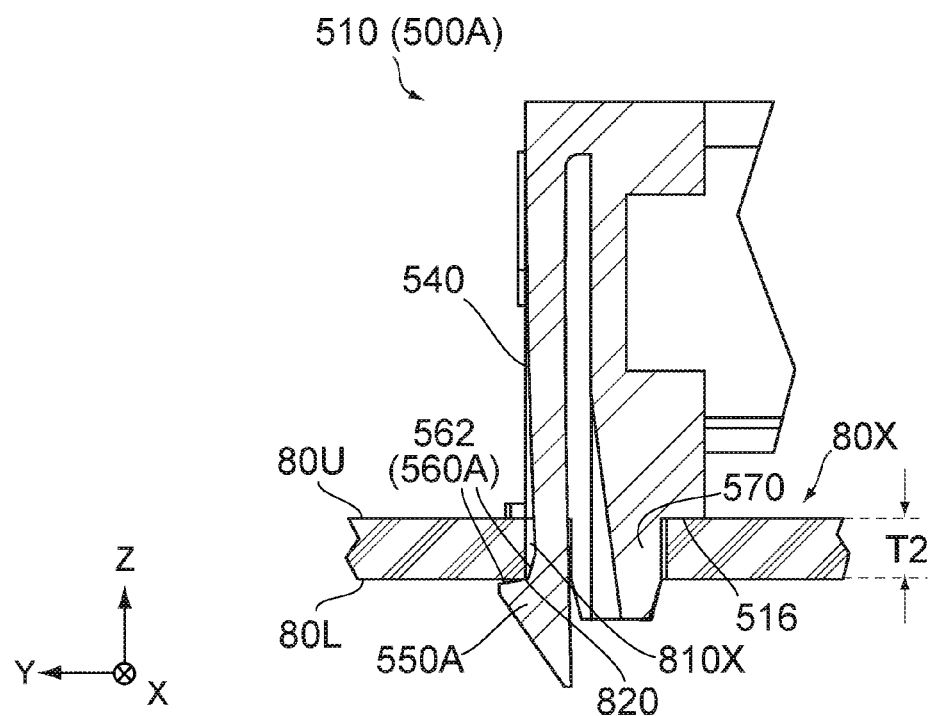
FIG. 14 is another cross-sectional view showing the side plate portion of the frame of FIG. 11. The frame is attached to the second circuit board.

As shown in FIGS. 13 and 14, when the connector 10 having the locked portions 560A is attached to the circuit board 80 (or the circuit board 80X) (see FIG. 1), one of the slope portions 562 of the locked portion 560A is brought into contact with a lower end (an end in the negative Z-direction) of a wall surface of each of the attachment holes 810 (or the attachment holes 810X) from below. The one of the slope portions 562 presses the lower end from below, so that the one of the slope portions 562 is locked. In other words, a lock portion 820 according to the first modification is the lower end of the wall surface of each of the attachment holes 810 (or the attachment holes 810X).

According to the first modification, one of the slope portions 562 of the locked portion 560A is brought into contact with each of the lock portions 820 from below under the attached state. The slope portion 562 is oblique to the Z-direction when the slope portion 562 is brought into contact with each of the lock portions 820. The number of the slope portions 562 according to the first modification is two. However, it is sufficient that the number of the slope portions 562 is one or more. In other words, it is sufficient that the locked portion 560A has one or more of the slope portions 562.

Second Modification

Figure 15:
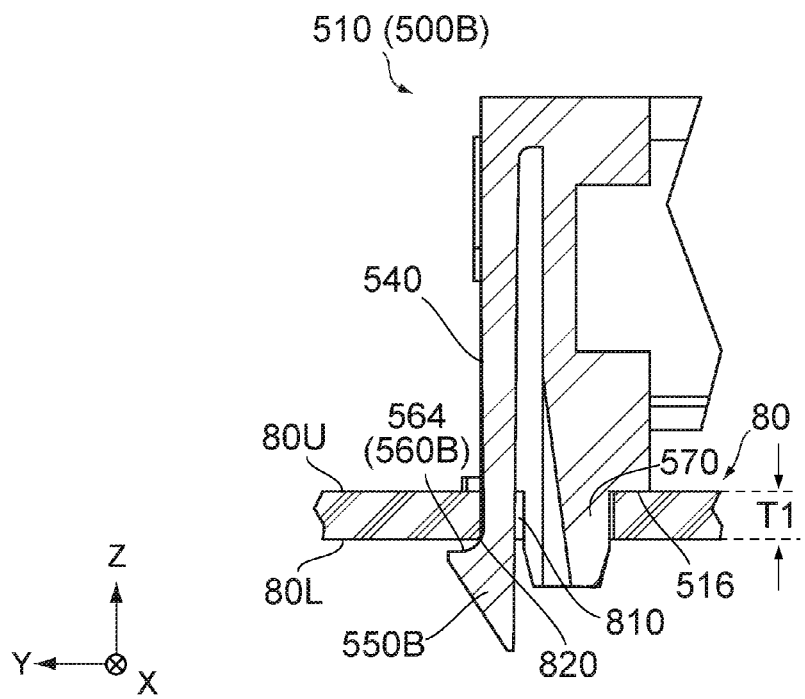
FIG. 15 is a cross-sectional view showing a side plate portion of another modification of the frame of FIG. 3. The frame is attached to the first circuit board.
Figure 16:
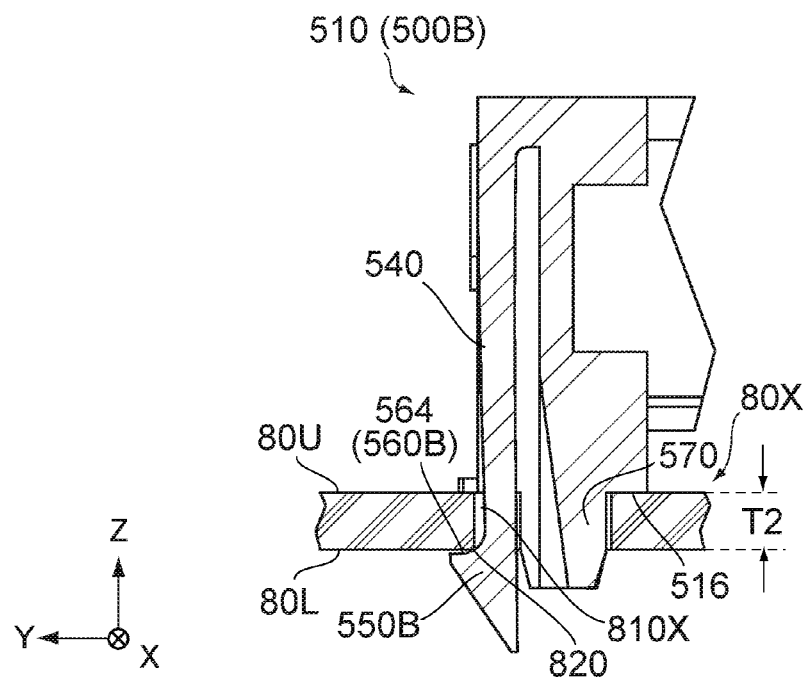
FIG. 16 is another cross-sectional view showing the side plate portion of the frame of FIG. 15. The frame is attached to the second circuit board.

As shown in FIGS. 15 and 16, a frame 500B according to a second modification has hooks 550B which are slightly different from the hooks 550 (see FIG. 3). Each of the hooks 550B has a locked portion 560B. Unlike the locked portion 560, the locked portion 560B has a curved portion 564. The curved portion 564 is curved in a YZ-plane.

When the connector 10 having the locked portions 560B is attached to the circuit board 80 (or the circuit board 80X) (see FIG. 1), the curved portion 564 of the locked portion 560B is brought into contact with the lower end of the wall surface of each of the attachment holes 810 (or the attachment holes 810X) from below. The curved portion 564 presses the lower end from below, so that the curved portion 564 is locked. In other words, a lock portion 820 according to the second modification is the lower end of the wall surface of each of the attachment holes 810 (or the attachment holes 810X). According to the second modification, the curved portion 564 is brought into contact with each of the lock portions 820 from below under the attached state.

The number of the curved portion 564 of the locked portion 560B according to the second modification is one. However, it is sufficient that the number of the curved portions 564 is one or more. In other words, it is sufficient that the locked portion 560B has one or more of the curved portions 564.

Third Modification

Figure 17:
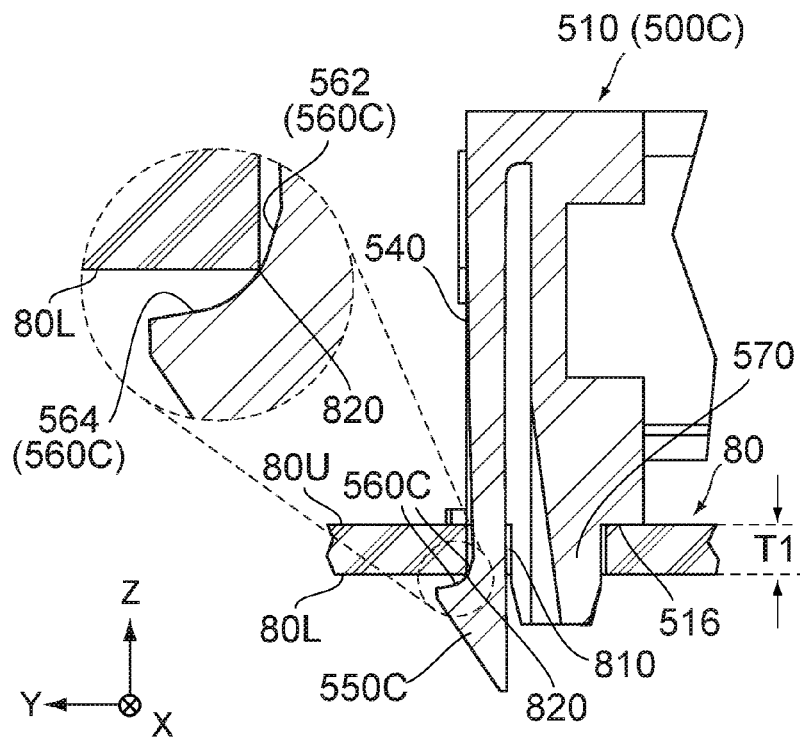
FIG. 17 is a cross-sectional view showing a side plate portion of yet another modification of the frame of FIG. 3. The frame is attached to the first circuit board. The vicinity of a locked portion (a part enclosed by dashed line) is shown enlarged.
Figure 18:
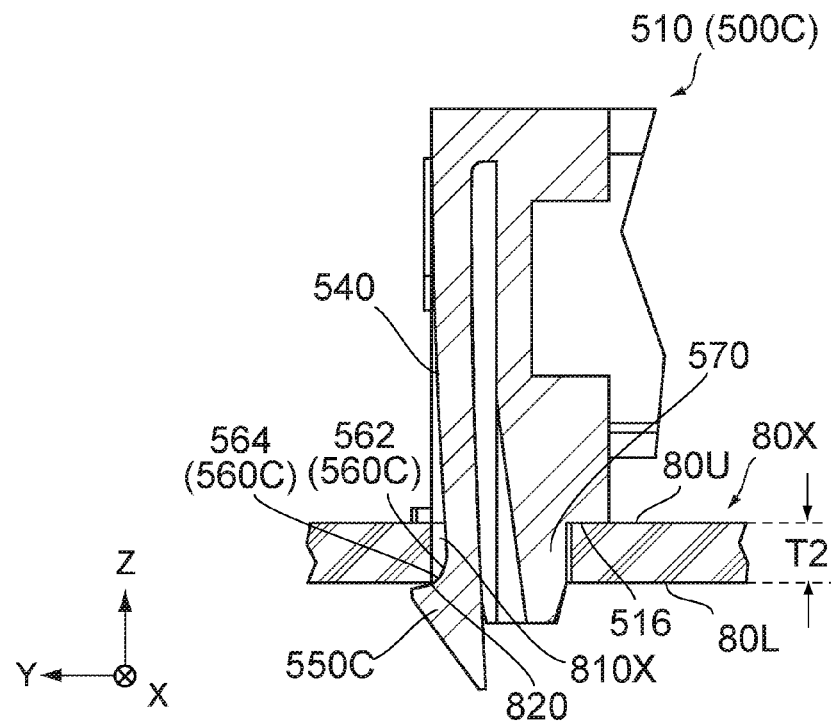
FIG. 18 is another cross-sectional view showing the side plate portion of the frame of FIG. 17. The frame is attached to the second circuit board.

As shown in FIGS. 17 and 18, a frame 500C according to a third modification has hooks 550C which are slightly different from the hooks 550B (see FIGS. 15 and 16). Each of the hooks 550C has a locked portion 560. Unlike the locked portion 560B, the locked portion 560C further has a slope portion 562 which is oblique to the Z-direction.

As shown in FIG. 17, when the connector 10 having the locked portions 560C is attached to the circuit board 80 (see FIG. 1), the slope portion 562 of the locked portion 560C is brought into contact with the lower end of the wall surface of each of the attachment holes 810 from below. The slope portion 562 presses the lower end from below, so that the slope portion 562 is locked. In addition, as shown in FIG. 18, when the connector 10 is attached to the circuit board 80X, the curved portion 564 of the locked portion 560C is brought into contact with the lower end of the wall surface of each of the attachment holes 810X from below. The curved portion 564 presses the lower end from below, so that the curved portion 564 is locked. In other words, a lock portion 820 according to the third modification is the lower end of the wall surface of each of the attachment holes 810 (or the attachment holes 810X).

The number of the slope portion 562 of the locked portion 560C according to the third modification is one. However, it is sufficient that the number of the slope portions 562 is one or more. In other words, it is sufficient that the locked portion 560C has one or more of the slope portions 562. In addition, it is sufficient that one of the curved portions 564 or one of the slope portions 562 is brought into contact with the lock portion 820 from below under the attached state.

Fourth Modification

Figure 19:
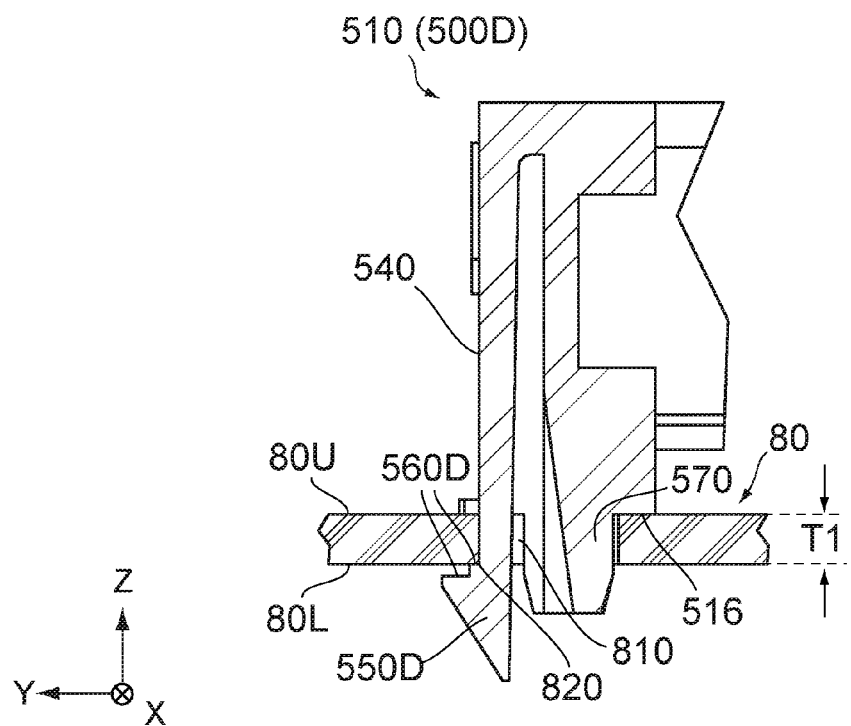
FIG. 19 is a cross-sectional view showing a side plate portion of still another modification of the frame of FIG. 3. The frame is attached to the first circuit board.
Figure 20:
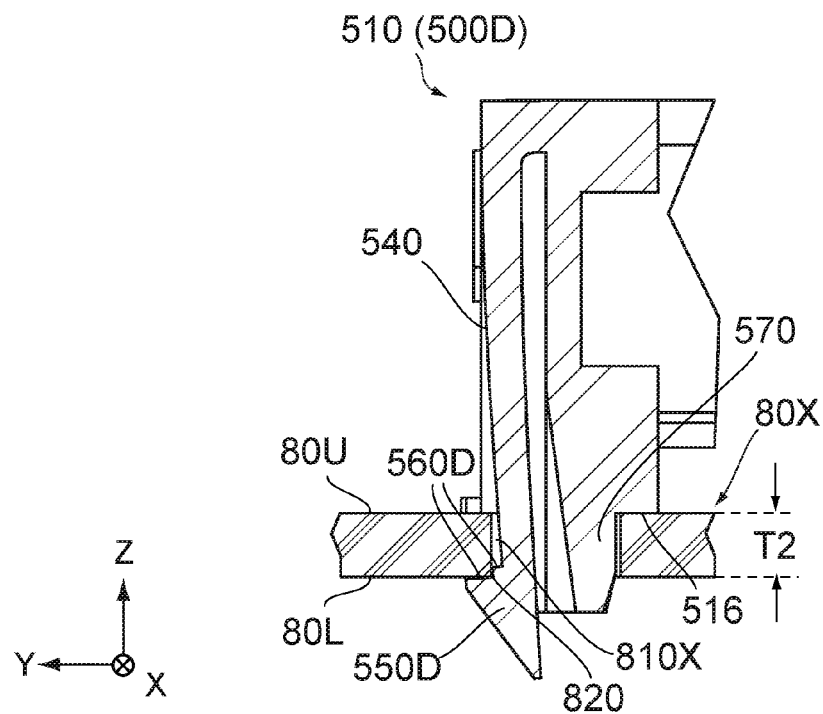
FIG. 20 is another cross-sectional view showing the side plate portion of the frame of FIG. 19. The frame is attached to the second circuit board.

As shown in FIGS. 19 and 20, a frame 500D according to a fourth modification has hooks 550D which are slightly different from the hooks 550 (see FIG. 3). Each of the hooks 550D has a locked portion 560D. Unlike the locked portion 560, the locked portion 560D has a stair shape in the YZ-plane.

When the connector 10 having the locked portions 560D is attached to the circuit board 80 (see FIG. 1), a part of the stair shape of each of the locked portions 560D is brought into contact with the lower surface 80L of the circuit board 80 from below. The locked portion 560D presses the lower surface 80L from below, so that the locked portion 560D is locked. In addition, as shown in FIG. 20, when the connector 10 is attached to the circuit board 80X, another part of the stair shape of the locked portion 560D is brought into contact with the lower end of wall surface of each of the attachment holes 810X from below. The locked portion 560D presses the lower end from below, so that the locked portion 560D is locked. In other words, a lock portion 820 according to the fourth modification is the lower surface 80L of the circuit board 80 or the lower end of the wall surface of each of the attachment holes 810X. According to the fourth modification, a part of the stair shape of the locked portion 560D is brought into contact with each of the lock portions 820 from below under the attached state.

As shown in FIGS. 13 to 20, according to the first to fourth modifications, the locked portions are surfaces of the hooks, respectively, similar to the locked portion 560. Under the attached state, each of the locked portions, as a whole, extends in a direction which intersects with the Z-direction.

As shown in FIGS. 9 and 10, when the frame 500 according to the present embodiment is attached to the circuit board 80 having a thin thickness, the contact surface 516 of each of the side plate portions 510 is positioned apart from and above the upper surface 80U of the circuit board 80. Accordingly, if, for example, vibration is applied to the frame 500, the frame 500 might be unstable. On the other hand, as shown in FIGS. 13 to 20, according to the first to fourth modifications, each of the locked portions can be locked while the contact surface 516 of each of the side plate portions 510 is brought into contact with the upper surface 80U when the frame is attached to any of the circuit board 80 and the circuit board 80X. In other words, according to the first to fourth modifications, the frame can be more stably attached to any of the circuit board 80 and the circuit board 80X.

The connector 10 according to the present embodiment can be further variously modified in addition to the above-explained modifications. For example, as shown in FIGS. 9, 10 and 13 to 20, each of the lock portions according to the present embodiment and the modifications is positioned in the vicinity of the lower end of the attachment hole. Under the attached state, the locked portion is inserted into each of the attachment holes. Furthermore, at least a part of the locked portion projects downward from the lower end of each of the attachment holes. However, the lock portion may not be a portion which is positioned in the vicinity of the attachment hole. The lock portion may be, for example, an edge of a notch (not shown) which is formed on the circuit board. In addition, the lock portion may be a part of a member (not shown) which is provided on a circuit board. However, in order to easily form the lock portion, it is preferable that the lock portion is a portion which is positioned in the vicinity of the attachment hole.

The connector 10 according to the present embodiment is installable in various electronic equipments as described below.

Figure 21:
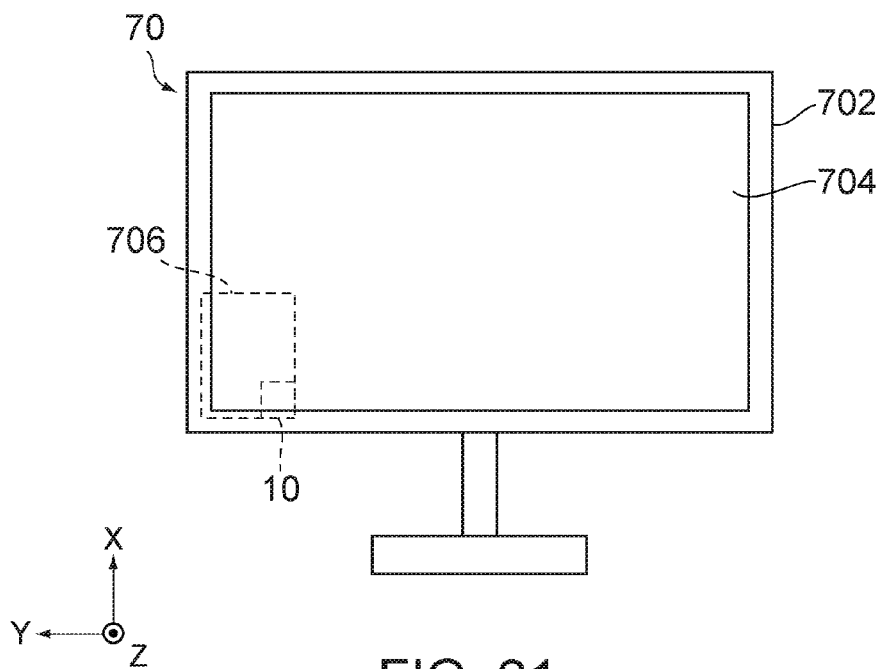
FIG. 21 is a front view showing an electronic equipment in which the connector of FIG. 1 is installed. An outline of a circuit board, which is arranged inside the electronic equipment, and an outline of the connector, which is attached to the circuit board, are illustrated by dashed line therein.
Figure 22:
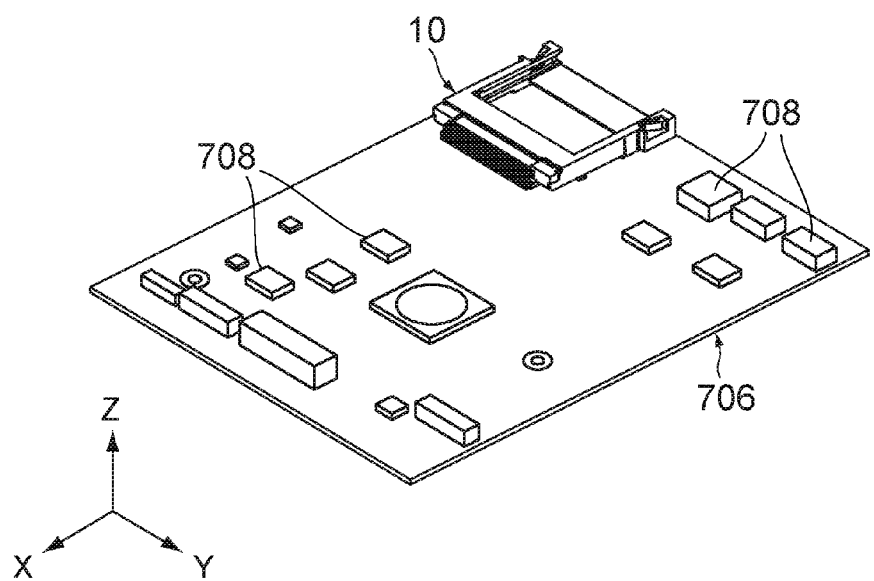
FIG. 22 is a perspective view showing the circuit board of FIG. 21.

Referring to FIGS. 21 and 22, a television receiver (electronic equipment) 70 comprises a housing 702, a display panel 704 and an object (circuit board) 706. The display panel 704 is attached to the housing 702 so as to be able to display images and videos. The display panel 704 can be formed by using, for example, a liquid crystal display, an organic EL (Electro Luminescence) display or a plasma display. The circuit board 706 is attached inside the housing 702.

Referring to FIG. 22, the circuit board 706 is similar to the circuit board 80 (see FIG. 2) and has a structure to which the connector 10 is attachable. In addition to the connector 10, various electronic devices 708 are attached to the circuit board 706. The connector 10 installed in the electronic equipment 70 as described above is used for, for example, inputting images, which are to be displayed on the display panel 704, thereto from a memory card (not shown).

Figure 23:
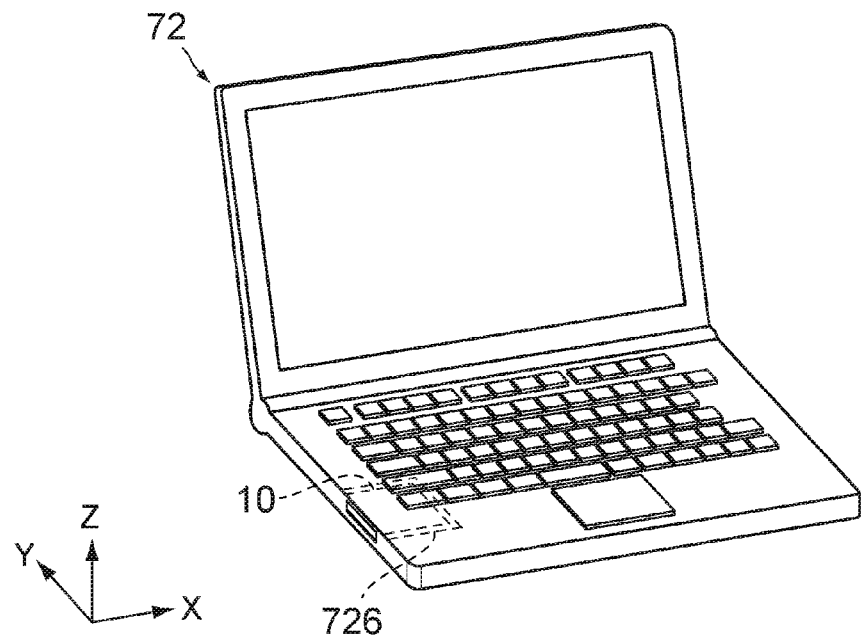
FIG. 23 is a perspective view showing another electronic equipment in which the connector of FIG. 1 is installed. An outline of a circuit board, which is arranged inside the electronic equipment, and an outline of the connector, which is attached to the circuit board, are illustrated by dashed line therein.
Figure 24:
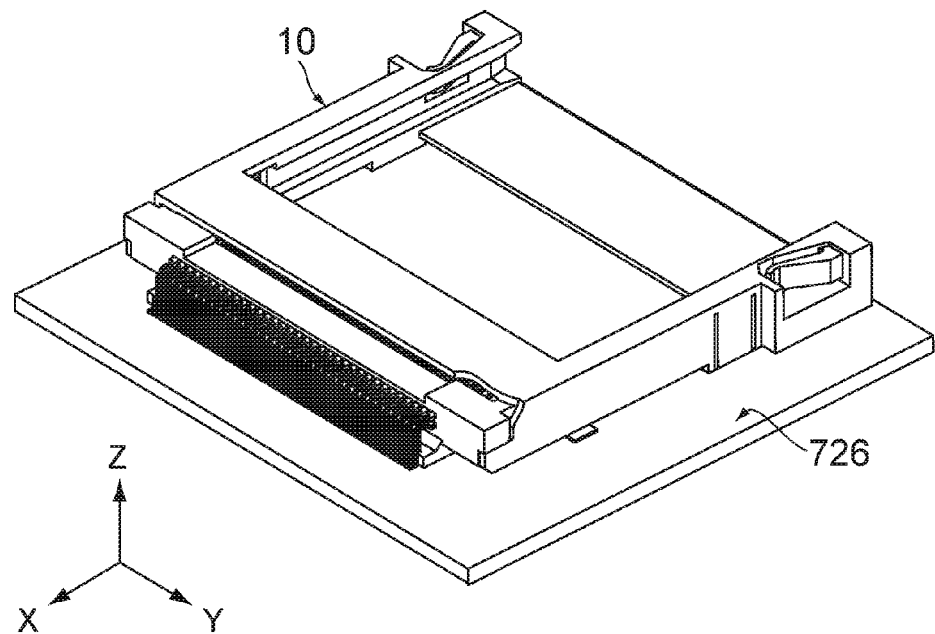
FIG. 24 is a perspective view showing the circuit board of FIG. 23.
Figure 25:
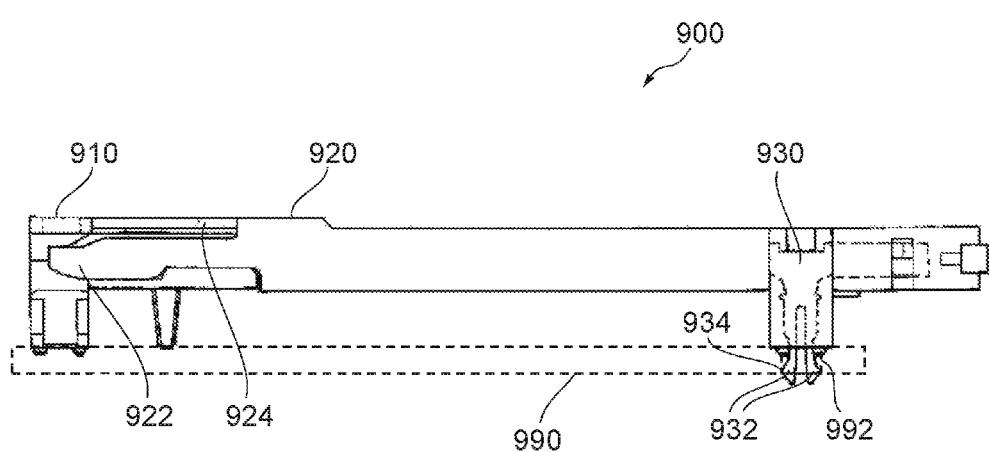
FIG. 25 is a side view showing a connector of Patent Document 1.

Referring to FIGS. 23 and 24, an electronic equipment 72, which is a PC (Personal Computer), comprises an object (circuit board) 726. The circuit board 726 is attached inside the electronic equipment 72.

Referring to FIG. 24, the circuit board 726 is similar to the circuit board 80 (see FIG. 2) and has a structure to which the connector 10 is attachable. Only the connector 10 is attached to the illustrated circuit board 726. However, an electronic equipment other than the connector 10 may be attached to the circuit board 726. The electronic equipment 72 can receive/output data from/to an external card (not shown) by installing the connector 10 in the electronic equipment 72.

The present application is based on a Japanese patent application of JP2014-086371 filed before the Japan Patent Office on Apr. 18, 2014, the content of which is incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

REFERENCE SIGNS LIST 10 connector
200 housing
210 holding portion
214 side portion
216 overhanging portion
218 lower surface
220 press portion
230 arm portion
232 upper surface (support surface)
240 support portion
300 holddown
400 contact
500, 500A, 500B, 500C, 500D frame
510 side plate portion
516 contact surface
520 front end portion
522 upper surface
524 projecting portion
530 pressed portion
540 spring portion
550, 550A, 550B, 550C, 550D hook
560, 560A, 560B, 560C, 650D locked portion
564 curved portion
570 positioning portion
572 bent portion
574 coupling portion
580 upper plate portion
584 lower surface (supported surface)
590 supported portion
70 television receiver (electronic equipment)
702 housing
704 display panel
706 object (circuit board)
708 electronic device
72 PC (electronic equipment)
726 object (circuit board)
80, 80X object (circuit board)
80U upper surface
80L lower surface
810, 810X attachment hole
820 lock portion
900 IC card connector (connector)
910 housing
920 frame
922 engagement piece
924 upper plate portion
930 ground terminal
932 engagement lug
934 projecting end
990 circuit board
992 attachment hole

The invention claimed is:

1. A connector attachable to an object having a lock portion, the connector comprising a housing and a frame, wherein:
the housing has a press portion and a support portion;
the housing is fixed to the object under an attached state where the connector is attached to the object;
the frame has a supported portion, a pressed portion and a locked portion;
when the connector is in the attached state, the supported portion is positioned between the pressed portion and the locked portion in a front-rear direction and is supported from below by the support portion in an up-down direction perpendicular to the front-rear direction;
under the attached state, the pressed portion is pressed by the press portion from above; and
under the attached state, the locked portion applies a force to the lock portion from below.

2. The connector as recited in claim 1, wherein:
under a state where the housing is fixed to the object, the frame is attached to the housing by a positioning operation followed by a rotating operation;
the positioning operation causes that the pressed portion is positioned below the press portion while the supported portion is positioned above the support portion;
the rotating operation rotates the frame from a tilted position, where the frame is tilted with respect to the housing, toward a horizontal position where the frame extends horizontally with respect to the housing; and
when the housing is fixed to the object while the frame is positioned at the horizontal position without being attached to the housing, a distance between the support portion and the press portion in the up-down direction is greater than another distance between the supported portion and the pressed portion in the up-down direction.

3. The connector as recited in claim 1, wherein:
the frame has a projecting portion; and
when the connector is in the attached state, the projecting portion projects upward in the up-down direction while the pressed portion is an upper end of the projecting portion.

4. The connector as recited in claim 3, wherein:
the housing has an overhanging portion and a support surface;
the overhanging portion extends outward in a width direction, which is perpendicular to both the up-down direction and the front-rear direction, to have a lower surface;
the press portion is a part of the lower surface of the overhanging portion;
when the connector is in the attached state, the support surface of the housing is positioned above the lower surface of the overhanging portion in the up-down direction;
the support portion is a part of the support surface of the housing;
the frame has a front end portion and an upper plate portion;
the front end portion has an upper surface;

the projecting portion is provided on the upper surface of the front end portion and projects upward from the upper surface of the front end portion under the attached state;

the upper plate portion has a supported surface;

under the attached state, the supported surface of the upper plate portion is positioned above the support surface of the housing; and the supported portion is an edge of the supported surface of the upper plate portion.

5. The connector as recited in claim 1, wherein:

the object has an attachment hole which pierces the object in the up-down direction;

the lock portion is positioned in the vicinity of a lower end of the attachment hole; and under the attached state, the locked portion is inserted into the attachment hole while at least a part of the locked portion projects downward from the lower end of the attachment hole.

6. The connector as recited in claim 5, wherein:

the frame has a hook;

the locked portion is a surface of the hook; and under the attached state, the locked portion as a whole extends in a direction intersecting with the up-down direction.

7. The connector as recited in claim 6, wherein:

under the attached state, the locked portion extends in a direction perpendicular to the up-down direction; and under the attached state, the locked portion is brought into contact with the lock portion from below.

8. The connector as recited in claim 6, wherein:

the locked portion has one or more slope portions; and under the attached state, one of the slope portions of the locked portion is oblique to the up-down direction and is brought into contact with the lock portion from below.

9. The connector as recited in claim 6, wherein:

the locked portion has one or more curved portions each of which is curved in a plane defined by the up-down direction and a width direction perpendicular to both the up-down direction and the front-rear direction; and under the attached state, one of the curved portions of the locked portion is brought into contact with the lock portion from below.

10. The connector as recited in claim 9, wherein:

the locked portion has one or more slope portions each of which is oblique to the up-down direction; and under the attached state, one of the curved portions or one of the slope portions of the locked portion is brought into contact with the lock portion from below.

11. The connector as recited in claim 6, wherein:

the locked portion has a stair shape in a plane defined by the up-down direction and a width direction perpendicular to both the up-down direction and the front-rear direction; and under the attached state, a part of the stair shape is brought into contact with the lock portion from below.

12. The connector as recited in claim 5, wherein:

the frame has a positioning portion; and under the attached state, the positioning portion is inserted into the attachment hole while carrying out positioning of the locked portion in the front-rear direction.

13. The connector as recited in claim 12, wherein at least a part of the positioning portion is positioned inward of the locked portion in a width direction perpendicular to both the up-down direction and the front-rear direction.

14. An electronic equipment in which the connector as recited in claim 1 is installed.

* * * * *

UNITED STATES PATENT AND TRADEMARK OFFICE
CERTIFICATE OF CORRECTION

| | |
|---|---|
| PATENT NO. | : 9,819,104 B2 |
| APPLICATION NO. | : 15/302969 |
| DATED | : November 14, 2017 |
| INVENTOR(S) | : Hisayoshi Ichikawa et al. |

It is certified that error appears in the above-identified patent and that said Letters Patent is hereby corrected as shown below:

Column 9, Line 17, delete "560." and insert -- 560C. --.

Signed and Sealed this
Twentieth Day of February, 2018

Andrei Iancu
*Director of the United States Patent and Trademark Office*